United States Patent
Lee

(10) Patent No.: US 7,615,772 B2
(45) Date of Patent: Nov. 10, 2009

(54) NITRIDE SEMICONDUCTOR LED AND FABRICATION METHOD THEREOF

(75) Inventor: Suk Hun Lee, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 28 days.

(21) Appl. No.: 10/517,818

(22) PCT Filed: Aug. 19, 2003

(86) PCT No.: PCT/KR03/01668

§ 371 (c)(1),
(2), (4) Date: Dec. 14, 2004

(87) PCT Pub. No.: WO2004/017431

PCT Pub. Date: Feb. 26, 2004

(65) Prior Publication Data

US 2005/0230688 A1    Oct. 20, 2005

(30) Foreign Application Priority Data

Aug. 19, 2002   (KR) .................. 10-2002-0049009

(51) Int. Cl.
*H01L 31/00* (2006.01)
(52) U.S. Cl. .................... 257/14; 257/94; 257/E33.028
(58) Field of Classification Search .................. 257/94, 257/57, 14, E33.028
See application file for complete search history.

(56) References Cited

U.S. PATENT DOCUMENTS

| 5,432,808 | A  | * | 7/1995  | Hatano et al. ............. 372/45.01 |
| 6,017,774 | A  | * | 1/2000  | Yuasa et al. .................... 438/46 |
| 6,452,214 | B2 | * | 9/2002  | Kaneyama et al. ............. 257/79 |
| 6,631,149 | B1 | * | 10/2003 | Tezen et al. ............. 372/45.012 |
| 6,800,876 | B2 | * | 10/2004 | Edmond et al. ............... 257/94 |
| 6,958,497 | B2 | * | 10/2005 | Emerson et al. ............... 257/94 |
| 7,141,444 | B2 | * | 11/2006 | Koike et al. .................... 438/34 |
| 2001/0048112 | A1 | * | 12/2001 | Koide et al. .................... 257/94 |

FOREIGN PATENT DOCUMENTS

| JP | 7-254733 A2 | 10/1995 |
| JP | 7-302929 A2 | 11/1995 |
| JP | 9-129925 A2 | 5/1997 |
| JP | 9-153643 A2 | 6/1997 |
| JP | 10-173220 A2 | 7/1998 |
| JP | 2001-7397 A2 | 1/2001 |
| JP | 2001-274096 | 5/2001 |

OTHER PUBLICATIONS

English computer translation of JP-2001-274096, provided on IDS filed Sep. 27, 2006.*

* cited by examiner

*Primary Examiner*—Wael Fahmy
*Assistant Examiner*—John C Ingham
(74) *Attorney, Agent, or Firm*—Birch, Stewart, Kolasch & Birch, LLP

(57) ABSTRACT

A nitride semiconductor LED includes a substrate; a GaN-based buffer layer formed on the substrate; $Al_yGa_{1-y}N/GaN$ short period superlattice (SPS) layers formed on the GaN-based buffer layer in a sandwich structure of upper and lower parts having an undoped GaN layer or an indium-doped GaN layer interposed therebetween (where $0 \leq y \leq 1$); a first electrode layer of an n-GaN layer formed on the upper $Al_yGa_{1-y}N/GaN$ SPS layer; an active layer formed on the first electrode layer; and a second electrode layer of a p-GaN layer formed on the active layer.

16 Claims, 3 Drawing Sheets

NITRIDE SEMICONDUCTOR LED AND FABRICATION METHOD THEREOF

TECHNICAL FIELD

The present invention relates to a nitride semiconductor, and more particularly, to a GaN-based nitride semiconductor light emitting device (LED) and a fabrication method thereof.

BACKGROUND ART

Generally, a GaN-based nitride semiconductor is applied to electronic devices that are high-speed switching and high power devices such as optic elements of blue/green LEDs, MESFET, HEMT, etc. In particular, the blue/green LED is under a state in which mass-production has been already progressed and a global sale is being exponentially increased.

The above-mentioned conventional GaN-based nitride semiconductor light emitting device (LED) is grown-up usually on a sapphire substrate or a SiC substrate. Further, at a low growth temperature, an $Al_yGa_{1-y}N$ polycrystalline layer is grown-up on the sapphire substrate or the SiC substrate as a buffer layer. After that, at a high temperature, an undoped GaN layer, an n-GaN layer doped with silicon over a $1\times10^{17}/cm^3$ concentration or a combined n-GaN layer thereof is formed on the buffer layer as a first electrode layer. Additionally, on an Mg-AlGaN cladding layer is formed an Mg-GaN layer as a second electrode layer to complete the GaN-based nitride semiconductor LED. Also, a light emitting layer (multi-quantum well active layer) is sandwiched between the first electrode layer and the second electrode layer.

However, the above-constructed conventional nitride semiconductor LED has a crystal defect of a very high value of about $10^8/cm^3$ or so, which is generated from an interface between the substrate and the buffer layer.

Accordingly, the conventional nitride semiconductor LED has a drawback in that an electric characteristic, specifically, leakage current under a reverse bias condition is increased, resulting in a fatal influence to the reliability of the device.

Also, the conventional nitride semiconductor LED has another drawback in that the crystal defect generated from the interface between the buffer layer and the substrate deteriorates crystallinity of the light emitting layer thereby lowering the light emitting efficiency.

DISCLOSURE OF THE INVENTION

An object of the present invention is to provide a nitride semiconductor LED and a fabrication method thereof for reducing a crystal defect generated due to a difference in a thermal expansion coefficient and a lattice constant between a substrate and a GaN-based single crystalline layer grown-up on the substrate, and improving crystallinity of the GaN-based single crystalline layer, to thereby improve the performance of the device and assure the reliability.

To achieve these and other advantages and in accordance with the purpose of the present invention, as embodied and broadly described, there is provided a nitride semiconductor LED including: a substrate; a GaN-based buffer layer formed on the substrate; $Al_yGa_{1-y}N/GaN$ short period superlattice (SPS) layers formed on the GaN-based buffer layer in a sandwich structure of upper and lower parts having an undoped GaN layer or an indium-doped GaN layer interposed therebetween (Here, $0\leq y \leq 1$); a first electrode layer of an n-GaN layer formed on the upper $Al_yGa_{1-y}N/GaN$ SPS layer; an active layer formed on the first electrode layer; and a second electrode layer of a p-GaN layer formed on the active layer.

According to another aspect of the present invention, there is provided a nitride semiconductor LED, including: a substrate; a GaN-based buffer layer formed on the substrate; a first electrode layer of an $n^+$-GaN layer formed on the GaN-based buffer layer and containing a high concentration of dopants; an n-GaN layer formed on the first electrode layer and containing a low concentration of dopants; an active layer formed on the n-GaN layer; and a second electrode layer of a p-GaN layer formed on the active layer.

According to still another aspect of the present invention, there is provided a fabrication method of a nitride semiconductor LED, the method including the steps of: growing-up a GaN-based buffer layer on a substrate; forming $Al_yGa_{1-y}N/GaN$ short period superlattice (SPS) layers on the GaN-based buffer layer in a sandwich structure of upper and lower parts having an undoped GaN layer or an indium-doped GaN layer interposed therebetween (Here, $0\leq y \leq 1$); forming a first electrode layer of an $n^+$-GaN layer containing a high concentration of dopants, on the upper $Al_yGa_{1-y}N/GaN$ SPS layer; forming an active layer on the first electrode layer; and forming a second electrode layer of an p-GaN layer on the active layer.

BEST MODE FOR CARRYING OUT THE INVENTION

Hereinafter, preferred embodiments of the present invention will be described in detail with reference to accompanying drawings.

Figure 1:
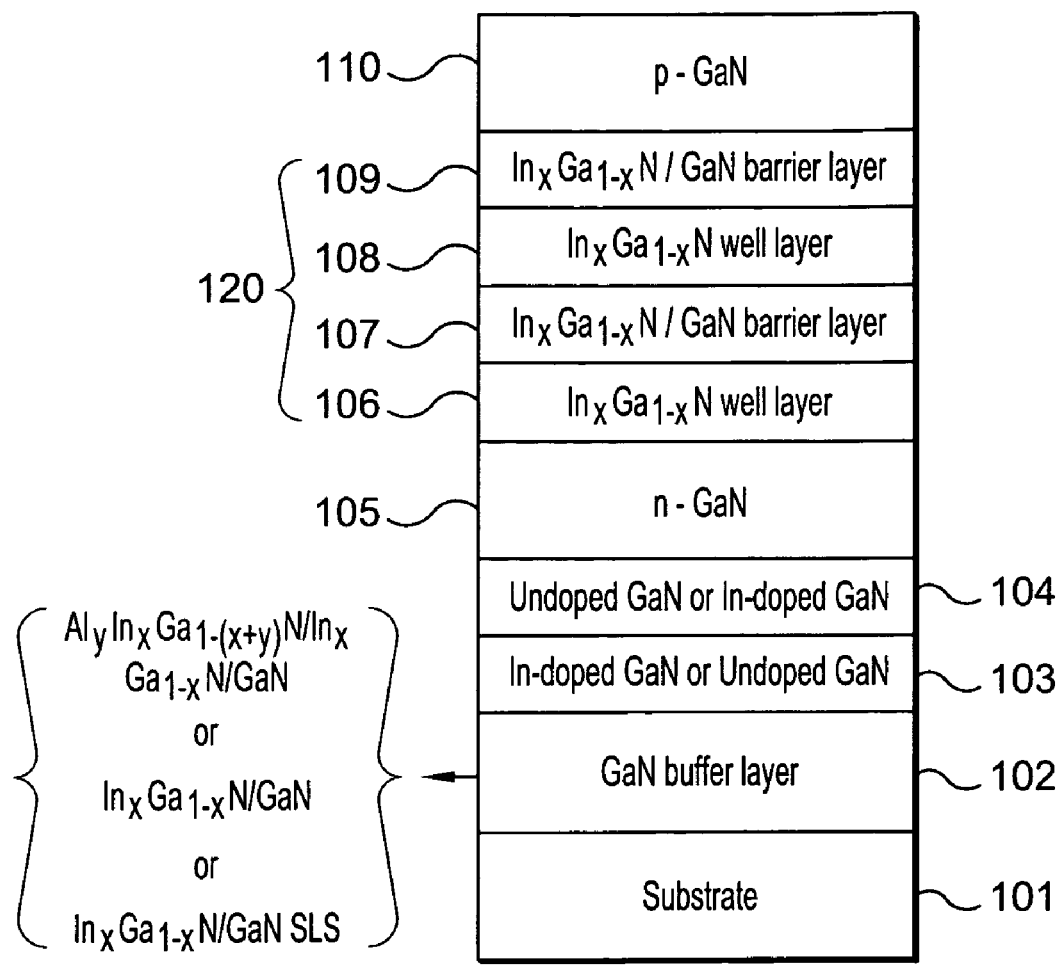
FIG. 1 is a sectional view illustrating a schematic construction of a nitride semiconductor LED according to a first embodiment of the present invention.

FIG. 1 is a sectional view illustrating a schematic construction of a nitride semiconductor LED according to a first embodiment of the present invention.

Referring to FIG. 1, the inventive nitride semiconductor LED includes a substrate 101; a GaN-based buffer layer 102 formed on the substrate 101; a first electrode layer of an n-GaN layer 105 formed on the GaN-based buffer layer 102; an active layer 120 formed on the first electrode layer; and a second electrode layer of a p-GaN layer 110 formed on the active layer 120.

Herein, the GaN-based buffer layer 102 can be formed having a triple-structured $Al_yIn_yGa_{1-(x+y)}N/In_xGa_{1-x}N/GaN$ (where $0\leq x \leq 1$, $0\leq y \leq 1$) laminated, a double-structured $In_xGa_{1-x}N/GaN$ (where $0\leq x \leq 1$) laminated, or a super-lattice-structured (SLS) $In_xGa_{1-x}N/GaN$ (where $0\leq x \leq 1$) laminated.

In other words, in the inventive nitride semiconductor LED, on the substrate 101 (for example, a sapphire substrate or a SiC substrate) is grown-up the GaN-based nitride semiconductor as the GaN-based buffer layer 102, the n-GaN layer 105 is formed as the first electrode layer, and an atomic Mg-doped p-GaN layer 110 is formed as the second electrode layer. Additionally, the active layer 120 having an InGaN/GaN multi-quantum well structure is formed in a sandwich combination structure between the first electrode layer of the n-GaN layer 105 and the second electrode layer of the p-GaN layer 110.

Here, the active layer 120 can be formed with an $In_xGa_{1-x}N$ well layer 106, an $In_xGa_{1-x}N/GaN$ barrier layer 107, an $In_xGa_{1-x}N$ well layer 108 and an $In_xGa_{1-x}N/GaN$ barrier layer 109. Further, between the GaN-based buffer layer 102 and the first electrode layer of the n-GaN layer 105 can be also additionally formed an undoped GaN layer or an indium-doped GaN layer 103 and 104.

Additionally, in a process of growing-up the GaN-based buffer layer 102 on the substrate 101 at a low temperature, a metal organic chemical vapor deposition (MOCVD) equipment is used such that it is, in a growth pressure of 100-700 torr and at a low temperature of 500°-800° C., grown-up to have a thickness of below 700 Å in a laminated structure such as the triple-structured $Al_yIn_xGa_{1-(x+y)}N/In_xGa_{1-x}N/GaN$, the double-structured $In_xGa_{1-x}N/GaN$ or the super-lattice-structured (SLS) $In_xGa_{1-x}N/GaN$, etc.

At this time, for growing-up the GaN-based buffer layer 102 at the low temperature, the MOCVD equipment is used having a carrier gas of H2, N2 supplied while a source gas of TMGa, TMIn, TMAl introduced and simultaneously a $NH_3$ gas introduced.

Further, in a high temperature process of growing-up the GaN-based single crystalline layer, on the GaN-based buffer layer 102 is, at a 900-1100° C. temperature, the undoped GaN layer or the indium-doped GaN layer 103 and 104, and on the result thereof is again formed an atomic silicon-doped n-GaN layer 105 (over a $1 \times 10^{18}/cm^3$ concentration). Herein, the n-GaN layer 105 is used as the first electrode layer and has a carrier concentration of over $1 \times 10^{18}/cm^3$.

At this time, for growing-up the GaN-based single crystalline layer, the MOCVD equipment is used having the source gas of TMGa, TMIn supplied at the 900-1100° C. temperature to grow-up the GaN-based single crystalline layer. Additionally, the TMGa, TMIn source gas is introduced for supplying at the 100-700 torr pressure and a 0.1-700 μmol/min flow rate to grow-up the GaN-based single crystalline layer. At this time, a $SiH_4$ gas is used as a dopant gas for doping a silicon atom.

Figure 2:
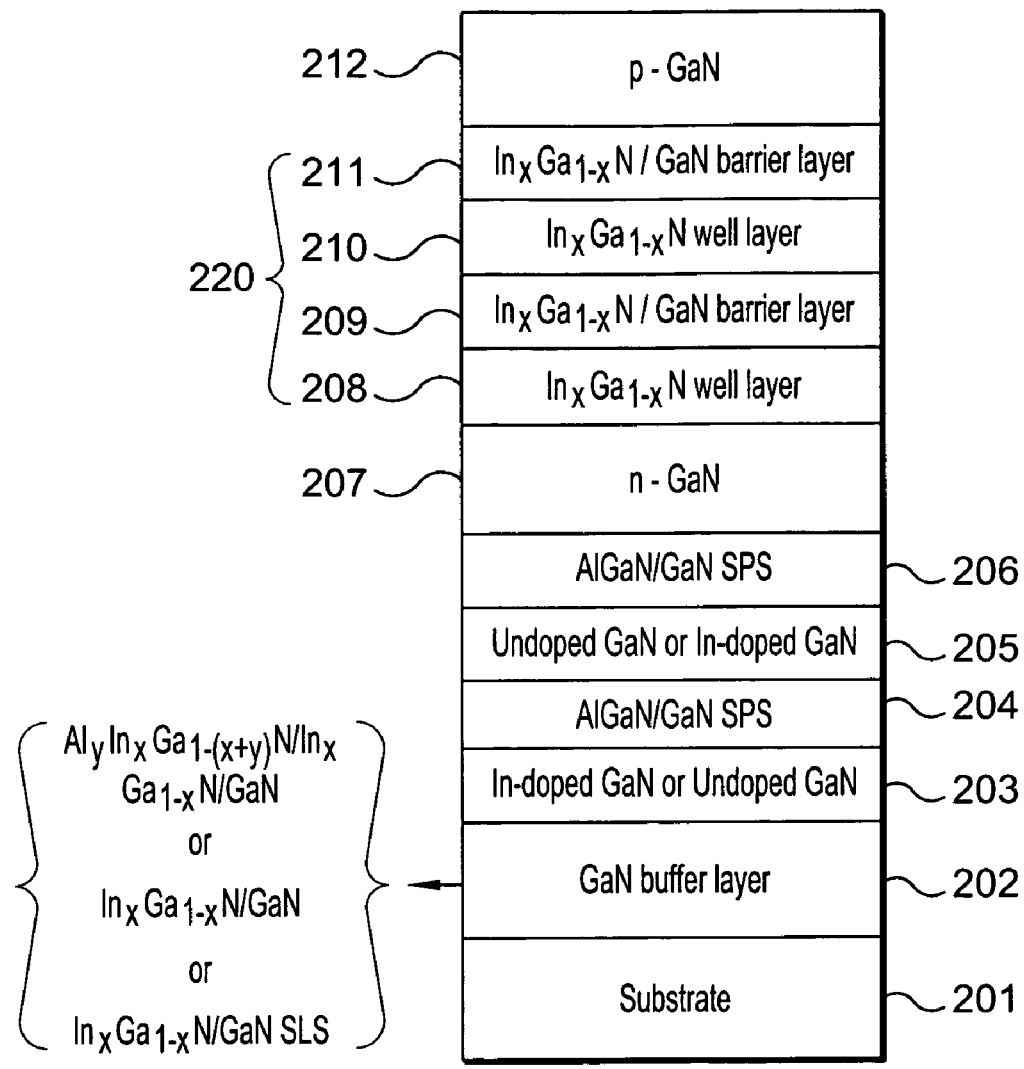
FIG. 2 is a sectional view illustrating a schematic construction of a nitride semiconductor LED according to a second embodiment of the present invention.

On the other hand, FIG. 2 is a sectional view illustrating a schematic construction of a nitride semiconductor LED according to a second embodiment of the present invention.

Referring to FIG. 2, in the inventive nitride semiconductor LED, on the substrate 201 (for example, the sapphire substrate or the SiC substrate) is provided the GaN-based buffer layer 202 having the triple-structured $Al_yIn_xGa_{1-(x+y)}N/In_xGa_{1-x}N/GaN$ (where $0 \leq x \leq 1$, $0 \leq y \leq 1$), the double-structured $In_xGa_{1-x}N/GaN$ (Here, $0 \leq x \leq 1$), or the super-lattice-structured (SLS) $In_xGa_{1-x}N/GaN$ (where $0 \leq x \leq 1$). Additionally, on the GaN-based buffer layer 202 is formed the undoped GaN layer or the indium-doped GaN layer 203.

Further, on the undoped GaN layer or the indium-doped GaN layer 203 are formed $Al_yGa_{1-y}N/GaN$ SPS layers 204 and 206 in a sandwich structure of upper and lower parts having the undoped GaN layer or the indium-doped GaN layer 205 interposed therebetween.

On the upper $Al_yGa_{1-y}N/GaN$ SPS layer 206 is formed the n-GaN layer 207 as the first electrode layer. Here, the first electrode layer of the n-GaN layer 207 has the carrier concentration of over $1 \times 10^{18}/cm^3$, and has the silicon used as the dopant.

Additionally, the nitride semiconductor LED includes, as a light emitting layer, an active layer 220 of $In_xGa_{1-x}N/GaN$. Here, the active layer 220 can be formed in the multi-quantum well structure having an $In_xGa_{1-x}N$ well layer 208, an $In_xGa_{1-x}N/GaN$ barrier layer 209, an $In_xGa_{1-x}N$ well layer 210 and an $In_xGa_{1-x}N/GaN$ barrier layer 211.

In the present invention, when the active layer 220 is formed, the $In_xGa_{1-x}N$ well layers 208 and 210 and the $In_xGa_{1-x}N/GaN$ barrier layers 209 and 211 are grown-up to respectively have a thickness of less than 70 Å at a 700-800° C. growth temperature and in a $N_2$ atmosphere. After that, the growth temperature is increased to a range of 900-1020° C. and a $Cp_2Mg$ doping gas is introduced so that a p-GaN layer 212 is grown-up in a 0.01-0.5 μm thickness to be used as a second electrode layer, and at this time, a mixed gas atmosphere of $NH_3$, $H_2$ as atmosphere gas is maintained with a high purity degree.

At this time, as shown in FIG. 2, the inventive nitride semiconductor LED includes the $Al_yGa_{1-y}N/GaN$ SPS layers 204 and 206. Accordingly, in order to evaluate an influence of the sandwich-structured $Al_yGa_{1-y}N/GaN$ SPS layers 204 and 206 upon a crystallinity variation, a structure is grown-up not including the $In_xGa_{1-x}N/GaN$ multi-quantum well structure of the active layer 220 and the second electrode layer of the p-GaN layer 212, and then a DC-XRD analysis is performed.

As a result of the above DC-XRD analysis, in case of a conventional nitride semiconductor having an undoped GaN/n-GaN structure as the buffer layer, a FWHM (full-width half-maximum) value of about 290 arcsec is obtained, but in case of having the inventive structure of FIG. 2, a FWHM value of about 250 arcsec is obtained. Considering the above, in case of having the sandwich-structured $Al_yGa_{1-y}N/GaN$ SPS layers 204 and 206 as in the present invention, it can be appreciated that the crystallinity is improved.

Furthermore, as a result of analyzing an electrical characteristic of the nitride semiconductor LED having the structure of FIG. 2, a forward bias characteristic such as an operation voltage (VF) and the brightness, etc. is not varied. However, it can be appreciated that, when the reverse bias is applied, a conventional reverse bias breakdown voltage is increased from "−15V" to over "−19V" so that the current leakage is improved.

The above-improved characteristic is caused by an effect of effectively reducing a dislocation formed in the substrate 201 and the GaN-based buffer layer 202 to be intruded into surface. And accordingly, it is caused by the result that the $In_xGa_{1-x}N/GaN$ multi-quantum well structure of the active layer 220 and the p-GaN layer 212 are improved in their crystallinities.

On the other hand, the present invention provides, for more improving the characteristic, the nitride semiconductor LED having the following structure.

Figure 3:
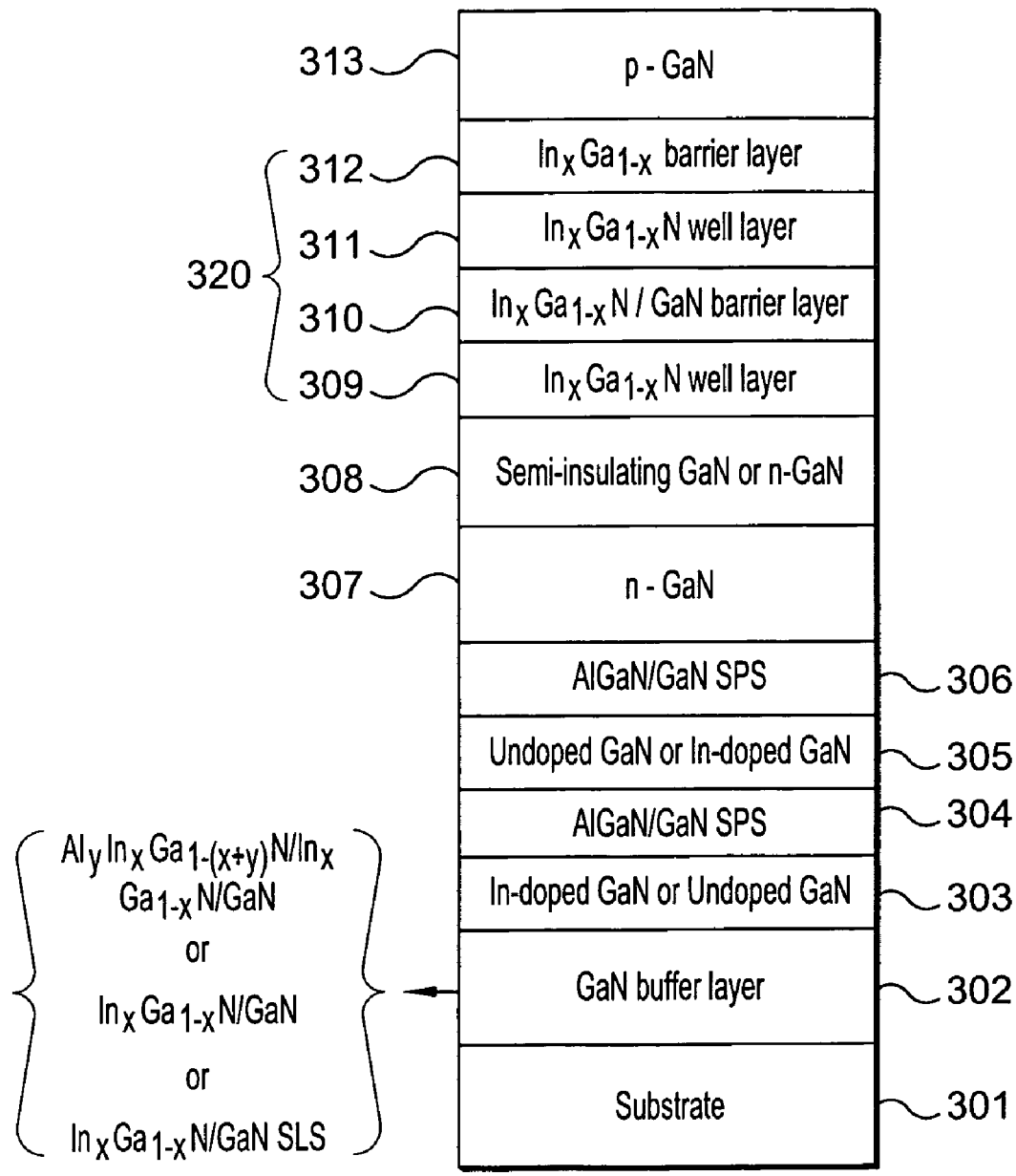
FIG. 3 is a sectional view illustrating a schematic construction of a nitride semiconductor LED according to a third embodiment of the present invention.

FIG. 3 is a sectional view illustrating a schematic construction of the nitride semiconductor LED according to a third embodiment of the present invention.

As shown in FIG. 3, in the inventive nitride semiconductor LED, on a first electrode layer of a high concentration doped $n^+$-GaN layer 307 is additionally grown-up a low concentration silicon of about $1 \times 10^{17}/cm^3$ doped n-GaN layer 308. Accordingly, in an interface of the $In_xGa_{1-x}N$ well layer 309 grown-up first in the $In_xGa_{1-x}N/GaN$ multi-quantum well structured active layer 320 grown-up at a relatively low growth temperature, a stress can be suppressed and crystallinity can be improved.

Here, in case the n-GaN layer 308 is formed with a semi-insulating GaN layer, it can also function as a role of a current prevention layer for effectively cutting off the current leakage which is, at the time of reverse bias, reversely intruded in the light emitting layer (multi-quantum well active layer).

Additionally describing, in case the nitride semiconductor LED is reversely biased, its crystallinity deterioration results in the current leakage. Accordingly, for preventing this, it can be formed in a structure having a thin semi-insulating GaN layer or a low concentration of below $1\times10^{18}/cm^3$ doped n-GaN layer inserted.

In other words, the inventive nitride semiconductor LED includes a substrate 301; a GaN-based buffer layer 302 formed on the substrate 301; a first electrode layer of an $n^+$-GaN layer 307 formed on the GaN-based buffer layer 302 and containing a high concentration of dopants; an n-GaN layer 308 formed on the first electrode layer and containing a low concentration of dopants; an active layer 320 formed on the n-GaN layer 308; and a second electrode layer of a p-GaN layer 313 formed on the active layer 320.

Here, on the substrate 301 is provided the GaN-based buffer layer 302 having the triple-structured $Al_yIn_xGa_{1-(x+y)}N/In_xGa_{1-x}N/GaN$ (where $0\leq x\leq 1$, $0\leq y\leq 1$), the double-structured $In_xGa_{1-x}N/GaN$ (where $0\leq x\leq 1$) or the super-lattice-structured (SLS) $In_xGa_{1-x}N/GaN$ (Here, $0\leq x\leq 1$). Additionally, on the GaN-based buffer layer 302 is formed an undoped GaN layer or an indium-doped GaN layer 303.

Further, on the undoped GaN layer or the indium-doped GaN layer 303 are formed $Al_yGa_{1-y}N/GaN$ SPS layers 304 and 306 in a sandwich structure of upper and lower parts having the indium-doped GaN layer 305 interposed therebetween.

On the upper $Al_yGa_{1-y}N/GaN$ SPS layer 306 is formed the $n^+$-GaN layer 307 as the first electrode layer. Here, the first electrode layer of the $n^+$-GaN layer 307 has the carrier concentration of over $1\times10^{18}/cm^3$ and has silicon used as the dopant.

Additionally, the nitride semiconductor LED includes, as the light emitting layer, the active layer 320 of $In_xGa_{1-x}N/GaN$. Here, the active layer 320 can be formed to have the multi-quantum well structure having an $In_xGa_{1-x}N$ well layer 309, an $In_xGa_{1-x}N/GaN$ barrier layer 310, an $In_xGa_{1-x}N$ well layer 311 and an $In_xGa_{1-x}N/GaN$ barrier layer 312.

On the other hand, in a fabrication method of the nitride semiconductor LED according to the present invention, when the undoped GaN layer and the indium-doped GaN layer 305 and 306, and the first electrode layer of the $n^+$-GaN layer 307 are grown-up, besides a high purity degree of $NH_3$ and $H_2$ carrier gases, a $N_2$ gas is mixed and used as the carrier gas. In the above-processed case, a thickness regularity doped and grown-up is improved. Additionally, from analysis of a forward and reverse electrical characteristic, an operation voltage and a reverse breakdown voltage can be obtained having a very regular dispersion distribution in a wafer.

INDUSTRIAL APPLICABILITY

As described above, the inventive semiconductor LED and its fabrication method can reduce the crystal defect caused by the difference of the thermal expansion coefficient and the lattice constant in the substrate and the GaN-based single crystalline layer grown-up on the substrate, and can improve the GaN-based single crystalline layer in its crystallinity. Accordingly, the present invention has an advantage in which the nitride semiconductor LED can be improved in its performance and assured in its reliability.

The invention claimed is:

1. A nitride semiconductor LED, comprising:
   a substrate;
   a buffer layer on the substrate, wherein the buffer layer has a triple-structured $Al_yIn_xGa_{1-(x+y)}N/In_xGa_{1-x}N/GaN$ laminated (where $0\leq x\leq 1$, $0\leq y\leq 1$);
   $Al_yGa_{1-y}N/GaN$ short period superlattice (SPS) layers on the buffer layer in a sandwich structure of upper and lower layers having an undoped GaN layer interposed therebetween (where $0<y\leq 1$);
   a first GaN based layer on the upper $Al_yGa_{1-y}N/GaN$ SPS layer;
   an n type GaN based layer on the first GaN based layer, wherein the n type GaN based layer comprises a semi-insulating GaN based layer and a low concentration of below $1\times10^{18}/cm^3$ doped n-GaN layer;
   an active layer on the n type GaN based layer; and
   a second GaN based layer formed on the active layer.

2. The nitride semiconductor LED of claim 1, comprising an undoped GaN layer or an indium-doped GaN layer on the buffer layer, wherein the first GaN based layer is n type GaN based layer and the second GaN based layer is p type GaN based layer.

3. A nitride semiconductor LED, comprising:
   a substrate;
   a buffer layer on the substrate;
   $Al_yGa_{1-y}N/GaN$ short period superlattice (SPS) layers on the buffer layer in a sandwich structure of upper and lower layers having an indium-doped GaN layer interposed therebetween (where $0<y\leq 1$);
   a first GaN based layer above the upper $Al_yGa_{1-y}N/GaN$ SPS layer;
   an n type GaN based layer on the first GaN based layer, wherein the n type GaN based layer comprises a semi-insulating GaN based layer and a low concentration of below $1\times10^{18}/cm^3$ doped n-GaN layer;
   an active layer on the n type GaN based layer; and
   a second GaN based layer formed on the active layer.

4. The nitride semiconductor LED of claim 3, wherein the buffer layer has a triple-structured $Al_yIn_xGa_{1-(x+y)}N/In_xGa_{1-x}N/GaN$ laminated (where $0\leq x\leq 1$, $0\leq y\leq 1$), a double-structured $In_xGa_{1-x}N/GaN$ laminated (where $0\leq x\leq 1$), or a super-lattice-structured (SLS) $In_xGa_{1-x}N/GaN$ laminated (where $0\leq x\leq 1$) or a single crystalline layer.

5. The nitride semiconductor LED of claim 3, comprising an undoped GaN layer or an indium-doped GaN layer on the buffer layer, wherein the first GaN based layer is n type GaN based layer and the second GaN based layer is p type GaN based layer.

6. A nitride semiconductor LED, comprising:
   a substrate;
   a buffer layer on the substrate;
   an indium-doped GaN layer on the buffer layer;
   $Al_yGa_{1-y}N/GaN$ short period superlattice (SPS) layers on the indium-doped GaN layer, in a sandwich structure of upper and lower layers having the indium-doped GaN layer interposed therebetween (where $0<y\leq 1$);
   a first n type GaN based layer on the upper $Al_yGa_{1-y}N/GaN$ SPS layer and containing a high concentration of dopants;
   a second n type GaN based layer on the first n type GaN based layer, wherein the second n type GaN based layer comprises a semi-insulating GaN based layer and a low concentration of below $1\times10^{18}/cm^3$ doped n-GaN layer;
   an active layer on the second n type GaN based layer; and
   a first p type GaN based layer on the active layer.

7. The nitride semiconductor LED of claim 6, wherein the buffer layer has a triple-structured $Al_yIn_xGa_{1-(x+y)}N/In_xGa_{1-x}N/GaN$ laminated (where $0\leq x\leq 1$, $0\leq y\leq 1$), a double-structured $In_xGa_{1-x}N/GaN$ laminated (where $0\leq x\leq 1$), or a super-lattice-structured (SLS) $In_xGa_{1-x}N/GaN$ laminated (where $0\leq x\leq 1$) or a single crystalline layer.

8. The nitride semiconductor LED of claim 6, wherein the dopant concentration of the first n type GaN based layer is more than $1\times10^{18}/cm^3$, and wherein the dopant concentration of the second n type GaN based layer is less than $1\times10^{18}/cm^3$.

9. A nitride semiconductor LED, comprising:
a substrate;
a buffer layer on the substrate, wherein the buffer layer has a triple-structured $Al_yIn_xGa_{1-(x+y)}N/In_xGa_{1-x}N/GaN$ laminated (where $0<x\leqq1$, $0\leqq y\leqq1$);
an undoped GaN layer or an indium-doped GaN layer on the buffer layer;
$Al_yGa_{1-y}N/GaN$ short period superlattice (SPS) layers on the undoped GaN layer or the indium-doped GaN layer, in a sandwich structure of upper and lower layers having the undoped GaN layer or the indium-doped GaN layer interposed therebetween (where $0<y\leqq1$);
a first n type GaN based layer above and in direct contact with the upper $Al_yGa_{1-y}N/GaN$ SPS layer and containing a high concentration of dopants;
a second n type GaN based layer on the first n type GaN based layer, wherein the second n type GaN based layer comprises a semi-insulating GaN based layer and a low concentration of below $1\times10^{18}/cm^3$ doped n-GaN layer;
an active layer on the second n type GaN based layer; and
a first p type GaN based layer on the active layer.

10. The nitride semiconductor LED of claim 9, wherein the dopant concentration of the first n type GaN based layer is more than $1\times10^{18}/cm^3$.

11. The nitride semiconductor LED of claim 9, wherein the dopant concentration of the second n type GaN based layer is less than $1\times10^{18}/cm^3$.

12. A fabrication method of a nitride semiconductor LED, the method comprising the steps of:
forming a buffer layer on a substrate, wherein the buffer layer has a triple-structured $Al_yIn_xGa_{1-(x+y)}N/In_xGa_{1-x}N/GaN$ laminated (where $0<x\leqq1$, $0\leqq y\leqq1$);
forming $Al_yGa_{1-y}N/GaN$ short period superlattice (SPS) layers on the buffer layer in a sandwich structure of upper and lower layers having an undoped GaN layer or an indium-doped GaN layer interposed therebetween (where $0<y\leqq1$);
forming a first GaN based layer above and in direct contact with the upper $Al_yGa_{1-y}N/GaN$ SPS layer;
forming an n type GaN based layer on the first GaN based layer, wherein the n type GaN based layer comprises a semi-insulating GaN based layer and a low concentration of below $1\times10^{18}/cm^3$ doped n-GaN layer;
forming an active layer on the n type GaN based layer; and
forming a second GaN based layer formed on the active layer.

13. The fabrication method of claim 12, comprising a step of forming an n-GaN layer containing a low concentration of dopants, between the first GaN based layer of a $n^+$-GaN layer and the active layer.

14. The fabrication method of claim 12, comprising forming an undoped GaN layer or an indium-doped GaN layer on the buffer layer, wherein the first GaN based layer is n type GaN based layer and the second GaN based layer is p type GaN based layer.

15. The fabrication method of claim 12, wherein forming the buffer layer is, using a MOCVD equipment, grown-up to have a 50-800 Å thickness at a 500-800° C. temperature and in an atmosphere having $H_2$ and $N_2$ carrier gases supplied while having TMGa, TMIn, TMA1 source gas introduced and simultaneously having $NH_3$ gas introduced.

16. The fabrication method of claim 12, wherein the dopant concentration of the first GaN based layer is more than $1\times10^{18}/cm^3$.

* * * * *